US010060968B2

United States Patent
Pounds

(10) Patent No.: US 10,060,968 B2
(45) Date of Patent: Aug. 28, 2018

(54) COMBINING CURRENT SOURCED BY CHANNELS OF AUTOMATIC TEST EQUIPMENT

(71) Applicant: Teradyne, Inc., North Reading, MA (US)

(72) Inventor: Douglas W. Pounds, Goffstown, NH (US)

(73) Assignee: Teradyne, Inc., North Reading, MA (US)

( * ) Notice: Subject to any disclaimer, the term of this patent is extended or adjusted under 35 U.S.C. 154(b) by 0 days.

(21) Appl. No.: 15/248,623

(22) Filed: Aug. 26, 2016

(65) Prior Publication Data

US 2018/0059172 A1    Mar. 1, 2018

(51) Int. Cl.
    *G01R 31/28*     (2006.01)
    *G01R 19/165*    (2006.01)
    *G01R 31/26*     (2014.01)

(52) U.S. Cl.
    CPC ... *G01R 31/2834* (2013.01); *G01R 19/16538* (2013.01); *G01R 31/2601* (2013.01); *G01R 31/2851* (2013.01)

(58) Field of Classification Search
    None
    See application file for complete search history.

(56) References Cited

U.S. PATENT DOCUMENTS

| 6,566,857 | B1 | 5/2003 | Kakizawa et al. |
| 2002/0186037 | A1* | 12/2002 | Eldridge ......... G01R 31/31721 |
| | | | 324/754.07 |
| 2005/0225349 | A1 | 10/2005 | Kojima |
| 2008/0303535 | A1 | 12/2008 | Goeke |
| 2009/0206843 | A1 | 8/2009 | Kojima |
| 2010/0030508 | A1 | 2/2010 | Gake |

OTHER PUBLICATIONS

International Search Report for PCT/US2017/034486, 3 pages (dated Aug. 2, 2017).
Written Opinion for PCT/US2017/034486, 7 pages (dated Aug. 2, 2017).

* cited by examiner

*Primary Examiner* — Jermele M Hollington
*Assistant Examiner* — Douglas X Rodriguez
(74) *Attorney, Agent, or Firm* — Choate, Hall & Stewart LLP

(57) ABSTRACT

An example test system includes: multiple channels, where each of the multiple channels is configured to force voltage and to source current; and circuitry to combine current sourced by the multiple channels to produce a combined current for output on a single channel to a device under test (DUT), where each of the multiple channels includes a load sharing resistor to control a contribution of the channel to the combined current.

18 Claims, 3 Drawing Sheets

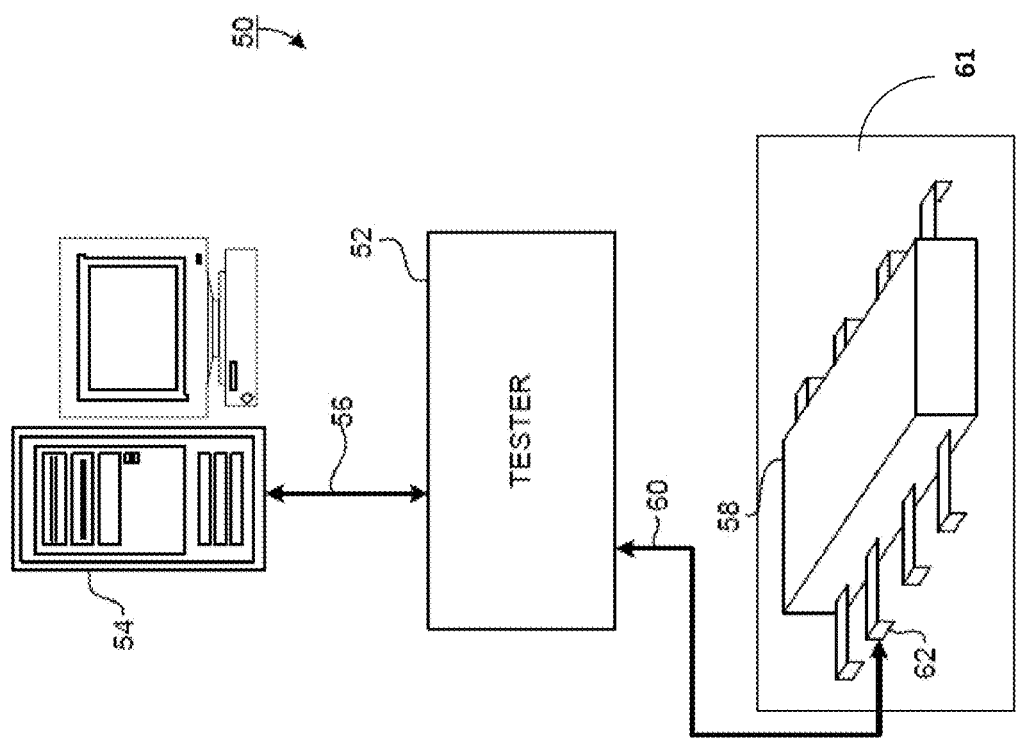

COMBINING CURRENT SOURCED BY CHANNELS OF AUTOMATIC TEST EQUIPMENT

TECHNICAL FIELD

This specification relates generally to combining current sourced by multiple channels of automatic test equipment to produce a combined current for output to a device under test.

BACKGROUND

Automatic Test Equipment (ATE) refers to an automated, usually computer-driven, system for testing devices. A device tested by ATE is generally referred to as a device under test (DUT). ATE typically includes a computer system and one or more test instruments or a single device having corresponding functionality. ATE is capable of providing test signals to a DUT, receiving response signals from the DUT, and forwarding those response signals for processing to determine whether the DUT meets testing qualifications. For example, in some implementations, ATE may be capable of forcing voltage to a DUT and sourcing current to the DUT.

SUMMARY

An example test system comprises: multiple channels, where each of the multiple channels is configured to force voltage and to source current; and circuitry to combine current sourced by the multiple channels to produce a combined current for output on a single channel to a device under test (DUT). Each of the multiple channels may comprise a load sharing resistor to control a contribution of the channel to the combined current. The example test system may include one or more of the following features, either alone or in combination.

The multiple channels may comprise a master channel and a slave channel, with the master channel being the single channel, with the master channel comprising a first force line and a first sense line, and with the master channel comprising a first load sharing resistor on the first force line and experiencing a voltage drop between the first force line and the first sense line. The circuitry may comprise: a detector circuit to detect the voltage drop; and an impedance circuit that is configurable to introduce a voltage based on the detected voltage drop into the slave channel. The slave channel may comprise a second force line comprising a second load sharing resistor and a second sense line comprising the impedance circuit, with the second force line being connected to the first force line to provide current to the master channel. The detector circuit may comprise an instrumentation amplifier having a first input connected to the first force line and a second input connected to first sense line, with the first load sharing resistor being connected between the first input and the DUT. The impedance circuit may comprise a variable resistor.

The load sharing resistor of each channel may have equal resistance. Load sharing resistors of different channels may have different resistances. The load sharing resistor of each channel may control the contribution of each channel to the combined current so that the contribution of each channel to the combined current is equal or of a specified percentage or amount. The multiple channels may be configured to operate in a force voltage mode when outputting the combined current on the single channel.

The multiple channels may comprise a master channel and multiple slave channels, with the master channel being the single channel, with the master channel comprising a first force line and a first sense line, and with the master channel comprising a first load sharing resistor on the first force line and experiencing a voltage drop between the first force line and the first sense line. The circuitry may comprise: a detector circuit configured to detect the voltage drop; and an impedance circuit that is included in each of the multiple slave channels and that is configurable to introduce a voltage that is based on the detected voltage drop into each of the multiple slave channels.

An example method comprises: detecting a voltage drop between a force line and a sense line on a channel between test electronics and a device under test (DUT), with the channel being a master channel and having a load sharing resistor on the force line; introducing a voltage into multiple slave channels that is based on the voltage drop, with each of the multiple slave channels having a force line containing a load sharing resistor, and with the load sharing resistor of each force line controlling an amount of current output from a corresponding force line; and combining currents from the multiple slave channels with current from the master channel to produce a combined current for output to the DUT. The example method may include one or more of the following features, either alone or in combination.

The voltage drop may be detected across the load sharing resistor and a force contact resistance of the master channel by an instrumentation amplifier that receives an input from the force line and an input from the sense line, with the instrumentation amplifier outputting a signal that is based on the voltage drop, and with the voltage introduced into the multiple slave channels being based on the signal. The load sharing resistor of the master channel may have a same resistance as load sharing resistors of each of the multiple slave channels. At least one load sharing resistor of the master channel or of the multiple slave channels may have a different resistance than at least one other load sharing resistor of the master channel or of the multiple slave channels. Each of the multiple slave channels may have a sense line, and the voltage may be introduced to the sense line of each of the multiple slave channels. The voltage introduced into each of the slave channels may be the same as the voltage drop detected in the master channel.

Example test equipment may comprise: a master channel to force voltage and to source current to a device under test (DUT); and means for combining currents of multiple slave channels with the current from the master channel to produce a combined current for output to the DUT along the master channel. The example test equipment may include one or more of the following features.

Each of the master channel and the multiple slave channels may have a force line and a sense line, with each sense line having a load sharing resistor to affect channel current output, and with each sense line being configurable based on a voltage drop on the master channel. The means for combining currents may comprise: an instrumentation amplifier to detect the voltage drop on the master channel based on inputs from the force line and the sense line of the master channel, and an impedance circuit on each sense line that is configurable based on the voltage drop detected. The current from the master channel and each of the currents of the multiple slave channels may have a same value.

Any two or more of the features described in this specification, including in this summary section, can be combined to form implementations not specifically described herein.

The test systems and techniques described herein, or portions thereof, can be implemented as/controlled by a computer program product that includes instructions that are stored on one or more non-transitory machine-readable storage media, and that are executable on one or more processing devices to control (e.g., coordinate) the operations described herein. The test systems and techniques described herein, or portions thereof, can be implemented as an apparatus, method, or electronic system that can include one or more processing devices and memory to store executable instructions to implement various operations.

The details of one or more implementations are set forth in the accompanying drawings and the description below. Other features and advantages will be apparent from the description and drawings, and from the claims.

DESCRIPTION OF THE DRAWINGS

FIG. 3 is a block diagram of example components of ATE.

Like reference numerals in different figures indicate like elements.

DETAILED DESCRIPTION

To test components, manufacturers commonly use ATE (or "testers"). In response to instructions in a test program set (TPS), some ATE automatically generates input signals to be applied to a device under test (DUT), and monitors output signals. The ATE compares the output signals with expected responses to determine whether the DUT is defective. ATE typically includes a computer system and one or more test instruments or a single device having corresponding functionalities. In some cases, the test instrument forces voltage and sources current to a DUT as part of a test protocol.

Examples of devices that may be tested using ATE include, but are not limited to, electronic devices, including circuits and electronics, computer hardware and software, computer memory (e.g., dynamic random access memory), digital camera sensors, and so forth In some implementations, during operation, circuitry in the ATE, such as pin electronics (PE), is configured to force voltage and to source or sink current to a DUT. In some implementations, the ATE has a limited amount of current sourcing and sinking capability when forcing voltage. In some cases, the testing requirements for a DUT may require more current than the ATE is capable of supplying. Described herein is an example test instrument, which is part of ATE, and which is configurable to combine or to connect multiple test instruments or test instrument channels in a force voltage mode to deliver a combined current to the DUT. By combining current in this manner, the test instrument can source more current on a single channel. In some implementations, each channel may be configured, as described herein, to provide the same amount of current, or each channel may be configured, as described herein, to provide different amounts of current. Any appropriate number of channels may be stably combined.

In some implementations, the example test instrument (or simply, instrument) combining currents from different sources employs a master-slave channel configuration. For example, the instrument may have a force/sense pair output channel that can be either on the high or low side of the instrument. The sense line adjusts for what is called Kelvin loss in the force line. Kelvin loss may be due, for example, to contact resistance or added resistance in the path as in load share resistors ($R_{SHARE}$). The example instrument described herein uses the Kelvin loss in the master channel to control an impedance in one or more slave channels. The impedance, in conjunction with a load sharing resistor ($R_{SHARE}$) in each slave channel, balances the channel current output—in some cases controlling the current so that an equal current is output from each channel, depending upon the size of the load sharing resistor in each channel. The example test instrument may combine any appropriate number of channels in this manner depending upon the required current for the DUT and the current sourcing capability of each channel.

Figure 1:
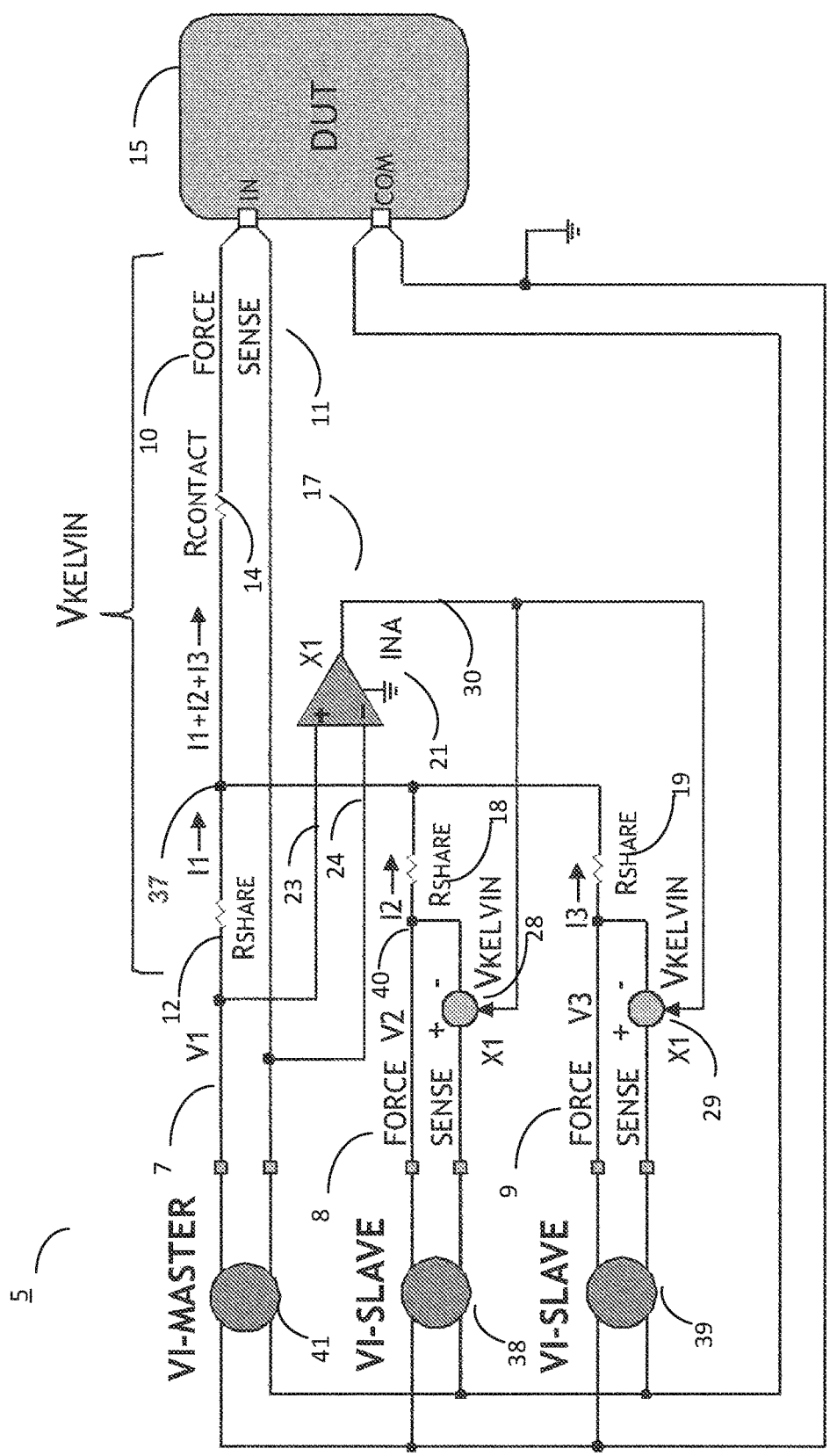
FIG. 1 is block diagram of an example implementation of part of a test instrument configured to combine current sourced by multiple channels of ATE to produce a combined current for output to a DUT.

FIG. 1 shows an example implementation of a part of a test instrument 5 that is configurable to combine current from multiple channels of ATE to produce a combined current for output on a single channel. In some implementations, test instrument 5 is a floating voltage-current (VI) instrument having a low force line and a low sense line and a high force line and a high sense line. In some implementations, the techniques described herein may be used on the high side or low side of a floating VI instrument or on a ground-based VI instrument.

Example instrument 5 includes multiple channels 7, 8, 9, each of which is configurable to force voltage and to source current in the force voltage mode. In this example, three channels are shown; however, any appropriate number of channels may be used, as described herein. In this example, the multiple channels include a master channel 7 and slave channels 8, 9. Any appropriate channel in a test instrument may be configured as either a master or a slave channel.

Master channel 7 is a single channel, and includes a force line 10 and a sense line 11. Master channel 7 also includes a load sharing resistor ($R_{SHARE}$) 12 on force line 10. During operation (e.g., during force voltage mode), master channel 7 experiences a voltage drop between force line 10 and the sense line 11. That voltage drop is the Kelvin drop described above. In the example of FIG. 1, the voltage drop is produced in part, by a force contact resistance, represented as resistor 14 ($R_{CONTACT}$) in the master channel. Each slave channel 8, 9 also constitutes a single channel, and each slave channel also includes a force line ("FORCE") and a sense line ("SENSE"). In this regard, in some implementations, a slave channel may be configured as a master channel and vice versa, e.g., using switching or programming to change the circuit configurations described herein.

As noted above, any appropriate number of channels may be used in a test instrument that employs the techniques described herein. For example, there may be a master channel and multiple slave channels, as shown. There may be a single master channel and a single slave channel. There may be multiple master channels, each of which operates with a single slave channel. There may be multiple master channels, each of which operates with multiple slave channels.

In the example of FIG. 1, the testing protocol for DUT 15 requires more current than master channel 7 alone is capable of sourcing. Accordingly, instrument 5 is configured to combine current from master channel 7 with currents from each of slave channels 8, 9 to output to DUT via master channel 7. To balance, and therefore control, the current provided by each channel, instrument 5 includes circuitry 17 to combine the current sourced by the multiple channels to produce the combined current for output to the DUT. As shown in FIG. 1, each of the multiple channels, including master channel 7 and slave channels 8, 9 includes a load sharing resistor ($R_{SHARE}$) configured to control, by virtue of its resistance value, a contribution of the respective channel to the combined current. In some implementations, the load sharing resistors each have the same resistance value, and in some implementations, the load sharing resistors of different channels have different values. For example, load sharing resistor 12, load sharing resistor 18, and load sharing resistor 19 may each have the same resistance value, or any two, or all three, of these resistors may have different resistance values.

In implementations where the load sharing resistors have the same resistance value, the current contribution from each channel to the total combined current may be the same. In implementations where the load sharing resistors have different resistance values, the current contribution from each channel to the total combined current may be proportionate to the resistance of the channel's corresponding load sharing resistor. For example, in an implementation where a slave channel 8 has a load sharing resistor that is twice the resistance of the load sharing resistors of each of master channel 7 and slave channel 9, then the contribution of slave channel 8 to the total combined current may be half the current contribution of each of master channel 7 and slave channel 9.

In some implementations, circuitry 17 includes a detector circuit 21 (INA) to detect the Kelvin voltage drop across master channel 7. The Kelvin voltage drop is detected across the load sharing resistor 12 ($R_{SHARE}$) of the master channel and the force contact resistance 14 ($R_{CONTACT}$) of the master channel by the detector circuit, which receives an input 23 from force line 10 and an input 24 from sense line 11. The detector circuit generates and outputs a signal that is based on the voltage drop. A voltage introduced into slave channels is based on that signal output.

More specifically, in some implementations, the detector circuit includes, or is, an instrumentation amplifier or similarly functioning circuitry having a first input 23 connected to force line 10 and a second input 24 connected to sense line 11. As shown in FIG. 1, $R_{SHARE}$ and $R_{CONTACT}$ are between first input 23 and DUT 15. Detector circuit 21 detects the Kelvin voltage drop along the master channel, and outputs a signal that is based on that Kelvin voltage drop. In some implementations, the signal is representative of the Kelvin voltage drop. The signal is used to control an impedance circuit that is connected on the sense line of each of the slave channels (e.g., impedance circuit 28 (X1) of channel 8 and impedance circuit 29 (X1) of channel 9). The impedance circuits each may be, or include, circuitry having an impedance that varies based on signal 30 output by the instrumentation amplifier. Thus, each impedance circuit is configurable to introduce, into its corresponding slave channel, an impedance, and thus a voltage drop for a given current, that is based on the detected Kelvin voltage of the master channel. In some implementations, each impedance circuit includes, or is, a variable resistor having a resistance that varies based on the detected Kelvin voltage (as represented by the signal output by the instrumentation amplifier). However, in some implementations, variable impedance circuitry other than a variable resistor may be used.

Figure 2:
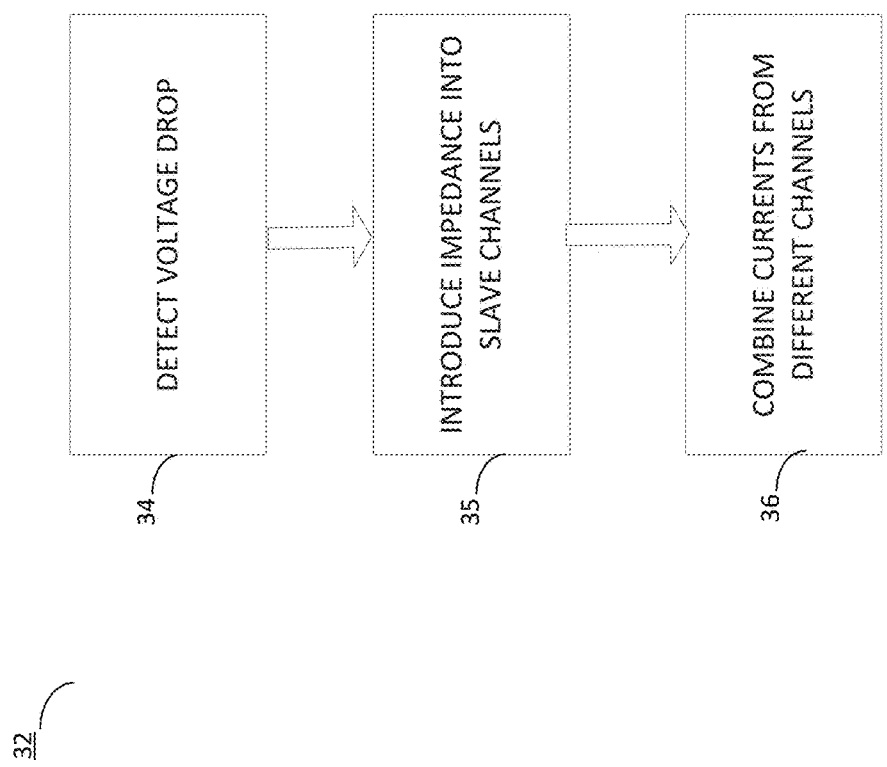
FIG. 2 is a flowchart of an example process performed by the part of the test instrument shown in FIG. 1.

Referring to FIG. 2, in operation 32, the instrumentation amplifier detects (34) the voltage drop (the Kelvin voltage) between appropriate points on force line 10 and sense line 11 of master channel 7. The detected voltage drop is introduced into each of the slave channels 8 and 9 by controlling the impedance (e.g., the resistance) of each slave channel's impedance circuit based on the output signal from the instrumentation amplifier (detector circuit 21). More specifically, the impedance circuits of the slave channels are controlled by the signal output of the instrumentation amplifier to introduce (35), into each of the multiple slave channels, an amount resistance that will produce the Kelvin voltage drop of the master channel for the current output from that channel. As a result, electrical conditions of the master channel are substantially replicated in each slave channel. This method Is not limited to a variable impedance and the same effect can be accomplished by using a fixed resistor in series with the sense lines of the slave channels, and a variable current source proportional to the Kelvin loss of the master channel can be applied across the fixed resistor to replicate the conditions of the master channel. The end effect is to replicate the master channel Kelvin conditions on the slave channel by whatever means of control can be accomplished.

Each slave channel has a load sharing resistor (RSHARE), as shown, which is connected between the intersection of its force and sense lines and the electrical connection point 37 of that slave channel to the master channel. The load sharing resistor (e.g., 18, 19) and impedance circuit (e.g., 28, 29) of each slave channel affect, e.g., control by virtue of their values, the output current from the corresponding slave channel to the master channel. The output current from each (e.g., one or more) slave channels is combined (36) with the current from the master channel to produce a combined current output to the DUT. This combined current output to the DUT passes through the master channel to a single pin or to a set of pins on the DUT, as appropriate. So, in the example of FIG. 1, the combined current is I1+I2+I3, where I1 represents current from the master channel and I2 and I3 represent currents from slave channels 8 and 9, respectively.

As noted, the load sharing resistor (e.g., 18) and impedance circuit (e.g., 28) of each slave channel affect the output current from each slave channel. In some implementations, each slave channel operates the same; therefore, only a single slave channel 8 is described. In slave channel 8, current is sourced from a current/voltage source 38 and output on the force line. At point 40, the current splits into a part that passes through $R_{SHARE}$ and combines with other currents (namely I2) and a part that passes back through the sense line. The amount of current that flows along each path is controlled by impedance circuit 28 and $R_{SHARE}$ 18. Because the impedance circuit is controlled to produce the same Kelvin voltage drop as the master channel, if the load sharing resistor (18) of the slave channel is the same as the load sharing resistor (12) of master channel 7, their currents will be the same; that is, I1 from the master channel equals I2 from the slave channel. As noted, varying $R_{SHARE}$ or other parameters may change the values of these currents, including the absolute values of the currents or their values relative to each other. In the example of FIG. 1, each voltage/current source 38, 39, 41 is connected to a common ground (COM) in the DUT. In some implementations, the grounding configuration may be different than that shown in the example. The example circuitry of FIG. 1 may be included in a single test instrument that is part of a single ATE configuration or the example circuitry of FIG. 1 may be included in different test instruments that are part of one or more different ATE configurations. For example, multiple channels of the same test instrument on the same ATE may be combined as shown in FIG. 1; multiple channels of different test instruments on the same ATE may be combined as shown in FIG. 1; and/or multiple channels of different test instruments on different ATE may be combined as shown in FIG. 1.

FIG. 3 shows a general ATE configuration in which the circuitry of FIG. 1 may be implemented. It is, however, emphasized that the circuitry of FIG. 1 is not limited to any particular ATE configuration, including that of FIG. 3, and that the circuitry may be incorporated into any appropriate ATE or non-ATE system.

Referring to FIG. 3, an example ATE system 50 for testing a DUT 58, such as those described herein, includes a tester (or "test instrument") 52. DUT 58 may be interfaced to a DIB 60.

Tester 52 may include a number of channels, which may be connected as shown in FIG. 1. To control tester 52, system 50 includes a computer system 54 that interfaces with tester 52 over a hardwire connection 56. In an example operation, computer system 54 sends commands to tester 52 to initiate execution of routines and functions for testing DUT 58. That control may include configuring the channels as in FIG. 1. Such executing test routines may initiate the generation and transmission of test signals to the DUT 58 and collect responses from the DUT. Various types of DUTs may be tested by system 50. In some implementations, the DUT may be any appropriate semiconductor or other device, such as an integrated circuit (IC) chip (e.g., memory chip, microprocessor, analog-to-digital converter, digital-to-analog converter, etc.) or other devices.

To provide test signals and collect responses from the DUT, tester 52 is connected to an interface to the internal circuitry of DUT 58. For example, the DUT may be inserted into a socket of DIB 61, which contains interfaces to electrical connections between the DUT and the tester. A conductor 60 (e.g., one or more conductive pathways) is connected to the interface and is used to deliver test signals (e.g., switching or DC test signals, etc.) to the internal circuitry of DUT 58. Conductor 60 also senses signals in response to the test signals provided by tester 52. For example, a voltage signal or a current signal may be sensed at pin 62 in response to a test signal and sent over conductor 60 to tester 52 for analysis. Such single port tests may also be performed on other pins included in DUT 58. For example, tester 52 may provide test signals to other pins and collect associated signals reflected back over conductors (that deliver the provided signals). By collecting the reflected signals, the input impedance of the pins may be characterized along with other single port testing quantities. In other test scenarios, a digital signal may be sent over conductor 60 to pin 62 for storing a digital value on DUT 58. Once stored, DUT 58 may be accessed to retrieve and send the stored digital value over conductor 60 to tester 52. The retrieved digital value may then be identified to determine if the proper value was stored on DUT 58.

Along with performing single port measurements, a two-port or multi-port test may also be performed by tester 52. For example, a voltage signal may be injected over conductor 60 into pin 62 in a force voltage mode, and a response signal may be collected from one or more other pins of DUT 58. This response signal may be provided to tester 52 to determine quantities, such as gain response, phase response, and other throughput measurement quantities. Other tests may also be performed. Tester 52 may source current to the DUT during force voltage mode, as described herein, based on the testing required.

While this specification describes example implementations related to "testing" and a "test system," the circuitry and method described herein may be used in any appropriate system, and are not limited to test systems or to the example test systems described herein.

Testing performed as described herein may be implemented using hardware or a combination of hardware and software. For example, a test system like the ones described herein may include various controllers and/or processing devices located at various points. A central computer may coordinate operation among the various controllers or processing devices. The central computer, controllers, and processing devices may execute various software routines to effect control and coordination of testing and calibration.

Testing can be controlled, at least in part, using one or more computer program products, e.g., one or more computer program tangibly embodied in one or more information carriers, such as one or more non-transitory machine-readable media, for execution by, or to control the operation of, one or more data processing apparatus, e.g., a programmable processor, a computer, multiple computers, and/or programmable logic components.

A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a network.

Actions associated with implementing all or part of the testing and calibration can be performed by one or more programmable processors executing one or more computer programs to perform the functions described herein. All or part of the testing and calibration can be implemented using special purpose logic circuitry, e.g., an FPGA (field programmable gate array) and/or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only storage area or a random access storage area or both. Elements of a computer (including a server) include one or more processors for executing instructions and one or more storage area devices for storing instructions and data. Generally, a computer will also include, or be operatively coupled to receive data from, or transfer data to, or both, one or more machine-readable storage media, such as mass PCBs for storing data, e.g., magnetic, magneto-optical disks, or optical disks. Machine-readable storage media suitable for embodying computer program instructions and data include all forms of non-volatile storage area, including by way of example, semiconductor storage area devices, e.g., EPROM, EEPROM, and flash storage area devices; magnetic disks, e.g., internal hard disks or removable disks; magneto-optical disks; and CD-ROM and DVD-ROM disks.

Any "electrical connection" as used herein may imply a direct physical connection or a connection that includes wired or wireless intervening components but that nevertheless allows electrical signals (including wireless signals) to flow between connected components. Any "connection" involving electrical circuitry mentioned herein through which electrical signals flow, unless stated otherwise, is an electrical connection and not necessarily a direct physical connection regardless of whether the word "electrical" is used to modify "connection".

Elements of different implementations described herein may be combined to form other embodiments not specifically set forth above. Elements may be left out of the structures described herein without adversely affecting their operation.

Furthermore, various separate elements may be combined into one or more individual elements to perform the functions described herein.

What is claimed is:

1. A test system comprising:
multiple channels, each of the multiple channels being configured to force voltage and to source current; and
circuitry to combine current sourced by the multiple channels to produce a combined current for output on a single channel to a device under test (DUT);
wherein each of the multiple channels comprises a load sharing resistor to control a contribution of a channel to the combined current, and
wherein at least one of multiple channels comprises an impedance circuit having an impedance that is controllable based on a voltage drop across the single channel to affect the contribution of the at least one of multiple channels to the combined current, wherein the multiple channels comprise a master channel and a slave channel, the master channel being the single channel, the master channel comprising a first force line and a first sense line, the master channel further comprising a first load sharing resistor on the first force line and experiencing the voltage drop between the first force line and the first sense line; wherein the circuitry comprises a detector circuit to detect the voltage drop; and wherein the impedance circuit is configurable to introduce a voltage that matches the detected voltage drop into the slave channel.

2. The test system of claim 1, wherein the slave channel comprises a second force line comprising a second load sharing resistor and a second sense line comprising the impedance circuit, the second force line being connected to the first force line to provide current to the master channel.

3. The test system of claim 1, wherein the load sharing resistor of each channel has equal resistance.

4. The test system of claim 1, wherein load sharing resistors of different channels have different resistances.

5. The test system of claim 1, wherein the load sharing resistor of each channel controls the contribution of each channel to the combined current so that the contribution of each channel to the combined current is equal or of a specified percentage or amount.

6. The test system of claim 1, wherein the multiple channels are configured to operate in a force voltage mode when outputting the combined current on the single channel.

7. The system of claim 1, wherein the multiple channels comprise multiple slave channels; and wherein an instance of the impedance circuit is included in each of the multiple slave channels and is configurable to introduce a voltage that is based on a detected voltage drop into each of the multiple slave channels.

8. A test system comprising:
multiple channels, each of the multiple channels being configured to force voltage and to source current; and
circuitry to combine current sourced by the multiple channels to produce a combined current for output on a single channel to a device under test (DUT), each of the multiple channels comprising a load sharing resistor to control a contribution of a channel to the combined current;
wherein the multiple channels comprise a master channel and a slave channel, the master channel being the single channel, the master channel comprising a first force line and a first sense line, the master channel comprising a first load sharing resistor on the first force line and experiencing a voltage drop between the first force line and the first sense line;
wherein the circuitry comprises:
a detector circuit to detect the voltage drop;
an impedance circuit that is configurable to introduce a voltage that is based on the detected voltage drop into the slave channel; and
wherein the detector circuit comprises an instrumentation amplifier having a first input connected to the first force line and a second input connected to first sense line, the first load sharing resistor being connected between the first input and the DUT.

9. The test system of claim 8, wherein the impedance circuit comprises a variable resistor.

10. A method comprising:
detecting a voltage drop between a force line and a sense line on a channel between test electronics and a device under test (DUT), the channel being a master channel and having a load sharing resistor on the force line;
in a sense line of each of one or more slave channels, configuring an impedance circuit based on the voltage drop to produce an impedance that causes a voltage drop on the one or more slave channels, the impedance being based on the voltage drop detected on the master channel, each of the one or more slave channels having a force line containing a load sharing resistor, the load sharing resistor of each force line controlling an amount of current output from a corresponding force line; and
combining currents from the multiple slave channels with current from the master channel to produce a combined current for output to the DUT.

11. The method of claim 10, wherein the load sharing resistor of the master channel has a same resistance as load sharing resistors of each of the multiple slave channels.

12. The method of claim 10, wherein at least one load sharing resistor of the master channel or of the multiple slave channels has a different resistance than at least one other load sharing resistor of the master channel or of the multiple slave channels.

13. The method of claim 10, wherein each of the multiple slave channels has a sense line, and the voltage is introduced to the sense line of each of the multiple slave channels.

14. The method of claim 10, the voltage introduced into each of the slave channels is the same as the voltage drop detected in the master channel.

15. A method comprising:
detecting a voltage drop between a force line and a sense line on a channel between test electronics and a device under test (DUT), the channel being a master channel and having a load sharing resistor on the force line;
introducing a voltage into multiple slave channels that is based on the voltage drop, each of the multiple slave channels having a force line containing a load sharing resistor, the load sharing resistor of each force line controlling an amount of current output from a corresponding force line; and
combining currents from the multiple slave channels with current from the master channel to produce a combined current for output to the DUT;
wherein the voltage drop is detected across the load sharing resistor and a force contact resistance of the master channel by an instrumentation amplifier that receives an input from the force line and an input from the sense line, the instrumentation amplifier outputting a signal that is based on the voltage drop, the voltage introduced into the multiple slave channels being based on the signal.

16. Test equipment comprising:
a master channel to force voltage and to source current to a device under test (DUT); and
means for combining currents of multiple slave channels with the current from the master channel to produce a combined current for output to the DUT along the master channel;
wherein each of the master channel and the multiple slave channels has a force line and a sense line, each force line having a load sharing resistor to affect channel current output, and at least one of the sense lines being configurable to have an impedance that is based on a voltage drop on the master channel, the impedance for affecting current output.

17. The test equipment of claim 16, wherein the current from the master channel and each of the currents of the multiple slave channels has a same value.

18. Test equipment comprising:
a master channel to force voltage and to source current to a device under test (DUT); and
means for combining currents of multiple slave channels with the current from the master channel to produce a combined current for output to the DUT along the master channel;
wherein each of the master channel and the multiple slave channels has a force line and a sense line, each force line having a load sharing resistor to affect channel current output, and each sense line being configurable based on a voltage drop on the master channel; and
wherein the means for combining currents comprises an instrumentation amplifier to detect the voltage drop on the master channel based on inputs from the force line and the sense line of the master channel, and an impedance circuit on each sense line that is configurable based on the voltage drop detected.

* * * * *